United States Patent
Yaegashi

(10) Patent No.: US 10,797,065 B2
(45) Date of Patent: Oct. 6, 2020

(54) NONVOLATILE SEMICONDUCTOR STORAGE DEVICE AND METHOD OF MANUFACTURE THEREOF

(71) Applicant: TOSHIBA MEMORY CORPORATION, Minato-ku (JP)

(72) Inventor: Toshitake Yaegashi, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 37 days.

(21) Appl. No.: 15/491,707

(22) Filed: Apr. 19, 2017

(65) Prior Publication Data

US 2017/0221918 A1    Aug. 3, 2017

Related U.S. Application Data

(60) Division of application No. 14/476,498, filed on Sep. 3, 2014, now Pat. No. 9,691,779, which is a
(Continued)

(30) Foreign Application Priority Data

Nov. 6, 2008 (JP) .................................. 2008-285516

(51) Int. Cl.
| | | |
|---|---|---|
| H01L 29/792 | (2006.01) |
| H01L 27/11563 | (2017.01) |
| H01L 21/28 | (2006.01) |
| H01L 29/423 | (2006.01) |
| H01L 27/11568 | (2017.01) |
| H01L 29/51 | (2006.01) |

(52) U.S. Cl.
CPC .. *H01L 27/11563* (2013.01); *H01L 27/11568* (2013.01); *H01L 29/40117* (2019.08);
(Continued)

(58) Field of Classification Search
CPC ......... H01L 21/28282; H01L 27/11563; H01L 27/11568; H01L 29/4234; H01L 29/517; H01L 29/792
See application file for complete search history.

(56) References Cited

U.S. PATENT DOCUMENTS 6,764,961 B2    7/2004   Ku et al.
7,253,467 B2    8/2007   Lee et al.
(Continued)

FOREIGN PATENT DOCUMENTS

JP    2006-245198    9/2006
JP    2008-53295     3/2008
(Continued)

OTHER PUBLICATIONS

Office Action dated May 21, 2013, in Japanese Patent Application No. 2008-285516, filed Nov. 6, 2008 (5 pages) with English Translation.

*Primary Examiner* — Meiya Li
(74) *Attorney, Agent, or Firm* — Oblon, McClelland, Maier & Neustadt, L.L.P.

(57) ABSTRACT

A nonvolatile semiconductor storage device including a number of memory cells formed on a semiconductor substrate, each of the memory cells has a tunnel insulating film, a charge storage layer, a block insulating film, and a gate electrode which are formed in sequence on the substrate. The gate electrode is structured such that at least first and second gate electrode layers are stacked. The dimension in the direction of gate length of the second gate electrode layer, which is formed on the first gate electrode layer, is smaller than the dimension in the direction of gate length of the first gate electrode layer.

20 Claims, 6 Drawing Sheets

Related U.S. Application Data continuation of application No. 14/030,811, filed on Sep. 18, 2013, now Pat. No. 8,878,282, which is a continuation of application No. 13/544,060, filed on Jul. 9, 2012, now Pat. No. 8,569,828, which is a continuation of application No. 12/565,056, filed on Sep. 23, 2009, now Pat. No. 8,222,687.

(52) U.S. Cl.
CPC ........ H01L 29/4234 (2013.01); H01L 29/517 (2013.01); H01L 29/792 (2013.01)

(56) References Cited

U.S. PATENT DOCUMENTS

| | | |
|---|---|---|
| 8,222,687 B2 | 7/2012 | Yaegashi |
| 9,691,779 B2 * | 6/2017 | Yaegashi ........... H01L 27/11563 |
| 2005/0157549 A1 * | 7/2005 | Mokhlesi .............. H01L 27/115 |
| | | 365/185.01 |
| 2008/0054341 A1 * | 3/2008 | Natori ............... H01L 21/28273 |
| | | 257/316 |
| 2008/0093660 A1 | 4/2008 | Park et al. |
| 2008/0237700 A1 | 10/2008 | Kim |
| 2008/0296657 A1 * | 12/2008 | Sung ................ H01L 21/28273 |
| | | 257/321 |
| 2009/0096011 A1 | 4/2009 | Hong |
| 2009/0294838 A1 | 12/2009 | Lee et al. |
| 2010/0327338 A1 | 12/2010 | Yaegashi |
| 2011/0175155 A1 | 7/2011 | Yaegashi |

FOREIGN PATENT DOCUMENTS

| | | |
|---|---|---|
| JP | 2008-124144 | 5/2008 |
| JP | 2008-160116 | 7/2008 |
| JP | 2008-235876 | 10/2008 |

* cited by examiner

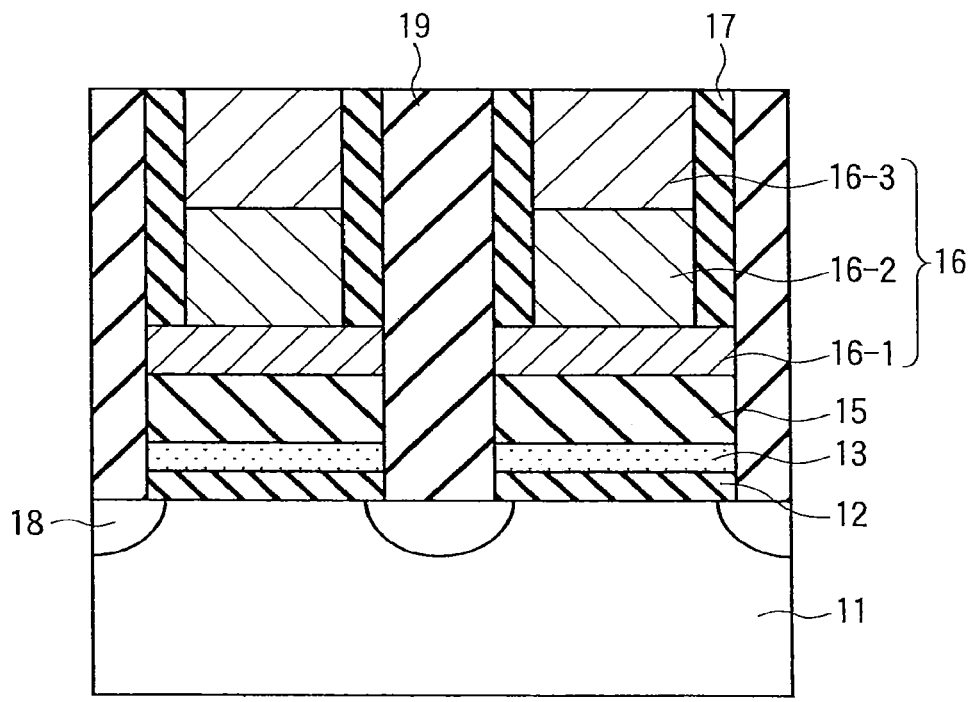
F I G. 1
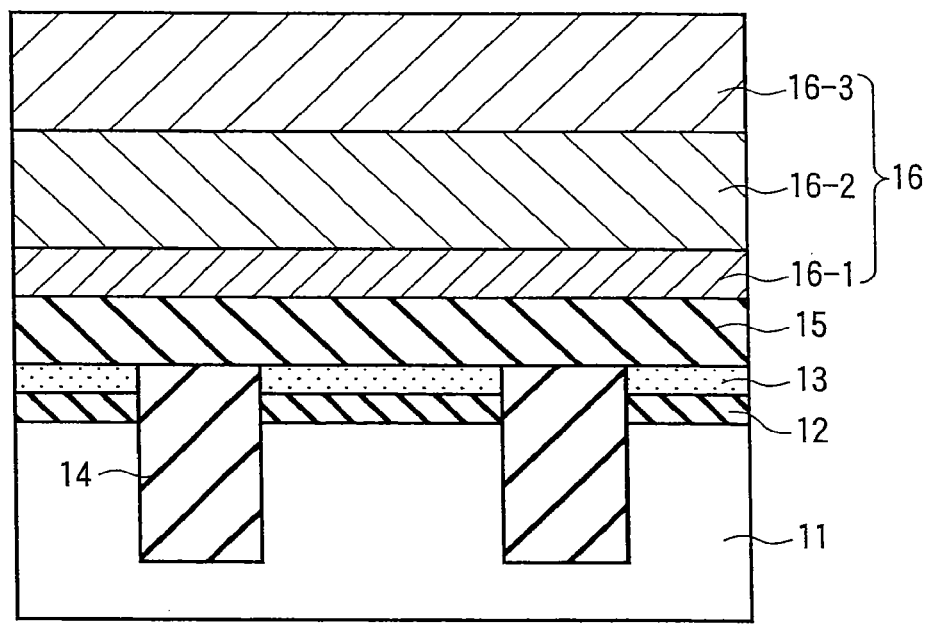
F I G. 2

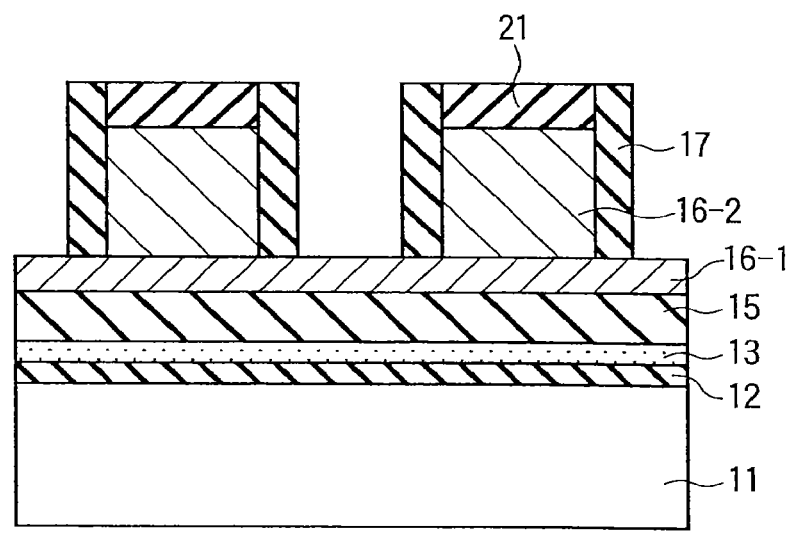
F I G. 5D
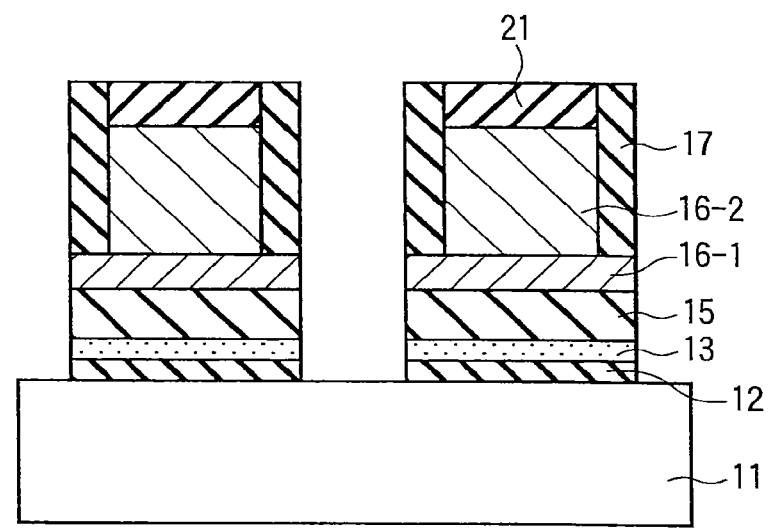
F I G. 5E
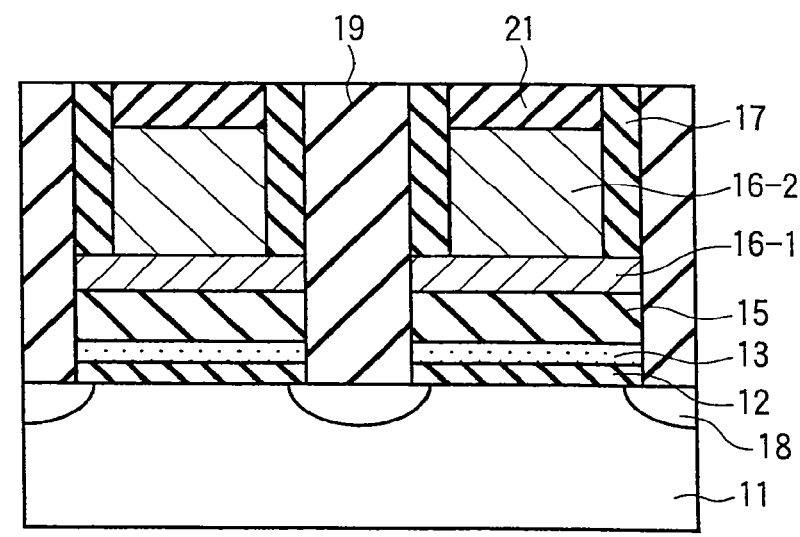
F I G. 5F

NONVOLATILE SEMICONDUCTOR STORAGE DEVICE AND METHOD OF MANUFACTURE THEREOF

CROSS-REFERENCE TO RELATED APPLICATIONS

This application is a divisional of U.S. application Ser. No. 14/476,498 filed Sep. 3, 2014, which is a continuation of U.S. application Ser. No. 14/030,811 filed Sep. 18, 2013, which is a continuation of U.S. application Ser. No. 13/544,060 filed Jul. 9, 2012, which is a continuation of U.S. application Ser. No. 12/565,056 filed Sep. 23, 2009 and is based upon and claims the benefit of priority from prior Japanese Patent Application No. 2008-285516, filed Nov. 6, 2008, the entire contents of each of which are incorporated herein by reference.

BACKGROUND OF THE INVENTION

1. Field of the Invention

The present invention relates to a nonvolatile semiconductor storage device and more particularly to a nonvolatile semiconductor storage device in which the gate electrode structure of transistors that form memory cells is improved and a method of manufacture thereof.

2. Description of the Related Art

Nonvolatile semiconductor memories which use metal oxide nitride oxide semiconductor (MONOS) cells for memory cell transistors are structured such that a tunnel insulating film, a charge storage layer, a block insulating film and a gate electrode are stacked on the device areas of a semiconductor substrate. Data of the MONOS cell is erased by injecting holes from the semiconductor substrate through the tunnel insulating film into the charge storage layer. At this point, electrons will be injected from the gate electrode through the block insulating film into the charge storage layer, causing a problem that sufficient erasing cannot be accomplished.

To solve the problem, conventionally, use has been made of a high-k film which has a larger dielectric constant than the tunnel insulating film as the block insulating film and a metal which has a larger work function than silicon as the gate electrode.

To prevent the short-channel effect of the memory cell transistors, it is required to increase the dimension in the direction of gate length of the gate electrodes. In addition, where a process in which the gate electrodes are oxidized is included, it is required to further increase the dimension in the direction of gate length of the gate electrodes. However, increasing the dimension in the direction of gate length of the gate electrodes becomes reducing space between adjacent gate electrodes. As a result of short-circuiting of adjacent gates is happen.

A proposal has been made for a device which is not the MONOS structure but one of the nonvolatile semiconductor memories having a stacked gate structure consisting of a floating gate and a control gate and which is formed such that the control gate is formed from two or more layers and the top electrode layer is formed with a film of oxide on the side (for example, Jpn. Pat. Appln. KOKAI Publication No. 2008-53295). With this device, however, an oxide film (sidewall insulating film) is also formed on the floating gate side, offering a problem that the gate length is reduced correspondingly. Furthermore, it is required to form an anti-oxidation film between the two gate layers which serve as the control gate, which makes the structure complex.

Therefore, application of the structure disclosed in the publication to the MONOS structure fails to solve the aforementioned problems.

BRIEF SUMMARY OF THE INVENTION

According to one aspect of the present invention, there is provided a nonvolatile semiconductor storage device including a number of memory cells, each of the memory cells comprising:

a semiconductor substrate;

a tunnel insulating film formed on the semiconductor substrate;

a charge storage layer consisting of an insulating film and formed on the tunnel insulating film;

a block insulating film formed on the charge storage layer; and a gate electrode formed on the block insulating film, the gate electrode being structured such that at least first and second gate electrode layers are stacked, the first gate electrode layer is in contact with the block insulating film, the second gate electrode layer is formed on the first gate electrode layer and consists of a material different from that of the first gate electrode layer, and the second gate electrode layer has a smaller dimension in the direction of gate length than the first gate electrode layer.

According to another aspect of the present invention, there is provided a nonvolatile semiconductor storage device including a number of memory cells, each of the memory cells comprising:

a semiconductor substrate;

a tunnel insulating film formed on the semiconductor substrate;

a charge storage layer consisting of an insulating film and formed on the tunnel insulating film;

a block insulating film formed on the charge storage layer; and a gate electrode formed on the block insulating film, the gate electrode being structured such that first, second and third gate electrode layers are stacked, the first gate electrode layer consists of a metal material and is in contact with the block insulating film, the second gate electrode layer consists of polysilicon and is formed on the first gate electrode layer so that its edges opposed to each other in the direction of gate length retract relative to the corresponding edges of the first gate electrode layer, and the third gate electrode layer consists of a metal silicide and formed on the second gate electrode layer.

According to a further aspect of the present invention, there is provided a method of manufacturing a nonvolatile semiconductor storage device, comprising:

forming a tunnel insulating film on a semiconductor substrate;

forming a charge storage film of an insulating material on the tunnel insulating film;

forming a block insulating film on the charge storage film;

forming a gate electrode on the block insulating film, the gate electrode comprising at least first and second gate electrode layers which are stacked and are different from each other in material;

processing the second gate electrode into a gate pattern;

forming a sidewall insulating film on the sides of the second gate electrode layer; and etching the first gate electrode layer using the second gate electrode layer and the sidewall insulating film as a mask.

BRIEF DESCRIPTION OF THE SEVERAL VIEWS OF THE DRAWING

FIG. 1 is a sectional view in the direction of gate length of a memory cell transistor portion of a NAND nonvolatile semiconductor memory according to a first embodiment;

FIG. 2 is a sectional view in the direction of gate width of a memory cell transistor portion of the NAND nonvolatile semiconductor memory according to the first embodiment;

FIGS. 5A through 5F are sectional views, in the order of steps of manufacture, of the memory cell transistor portion in the first embodiment;

DETAILED DESCRIPTION OF THE INVENTION

Figure 3:
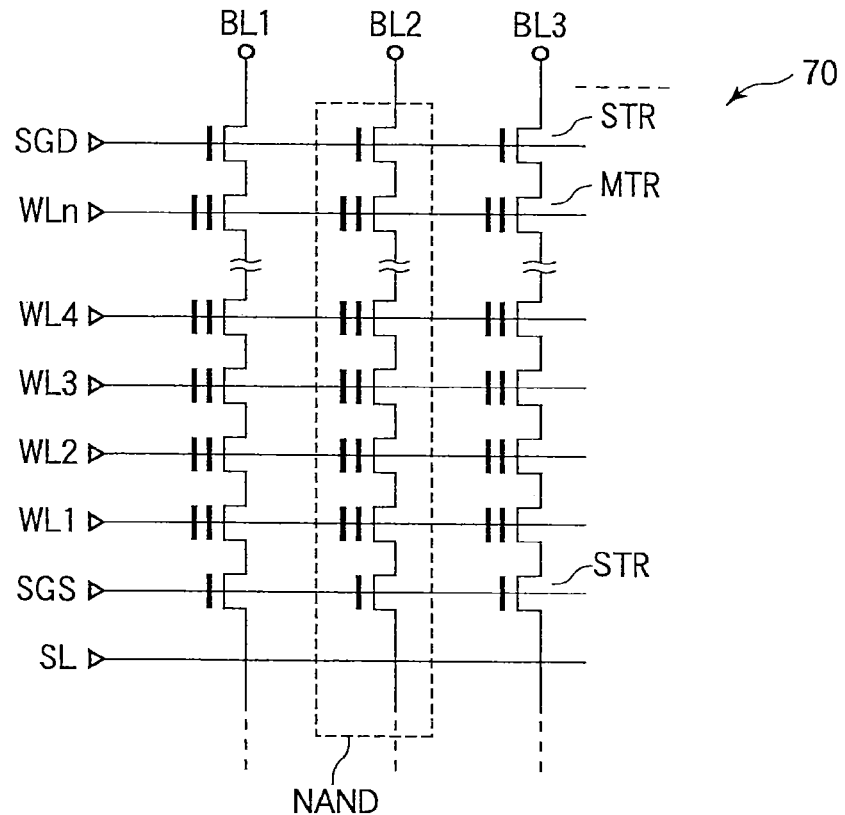
FIG. 3 shows the circuit arrangement of a NAND nonvolatile semiconductor memory as an example of a nonvolatile semiconductor storage device using memory cells of the structure shown in FIGS. 1 and 2.

The embodiments of the present invention will be described hereinafter with reference to the accompanying drawings.

First Embodiment

FIGS. 1 and 2 are sectional views in the directions of gate length and gate width, respectively, of a memory cell transistor portion of a NAND nonvolatile semiconductor memory according to a first embodiment of the present invention.

Device isolation regions 14 is formed buried in a surface portion of a silicon substrate (semiconductor substrate) 11 so that device isolation regions 14 surround device regions. A tunnel insulating film 12 of silicon oxide is formed on the device regions surrounded by the device isolation regions 14. A charge storage layer 13 of silicon nitride is formed on the tunnel insulating film 12. Here, a surface of the device isolation regions 14 is substantially the same level as the charge storage layer 13.

A block insulating film 15, which is an $Al_2O_3$ film for example, is formed on the charge storage layer 13 and the device isolation regions. A gate electrode 16 is formed on the block insulating film 15. The tunnel insulating film 12, the charge storage layer 13, the block insulating film 15 and the gate electrode 16 are processed into a gate pattern as shown in FIG. 1.

The gate electrode 16 includes a first electrode layer 16-1 formed on the block insulating film 15, a second electrode layer 16-2 formed on the first electrode layer 16-1, and a third electrode layer 16-3 formed on the second electrode layer 16-2. For example, the first, second and third electrode layers 16-1, 16-2 and 16-3 are made of TaN, polysilicon, and NiSi, respectively.

A first insulating film 17 of, say, silicon oxide is formed on portions at both ends of the top surface of the first electrode layer 16-1 and on the sidewalls of the second and third electrode layers 16-2 and 16-3 in the direction of gate length. Source/drain diffusion layers 18 of a memory cell transistor are formed in the surface of the silicon substrate 11 so that the region between them is located below the gate electrode 16. A second insulating film 19 as a silicon oxide is formed each of the source/drain diffusion layers 18.

Figure 8:
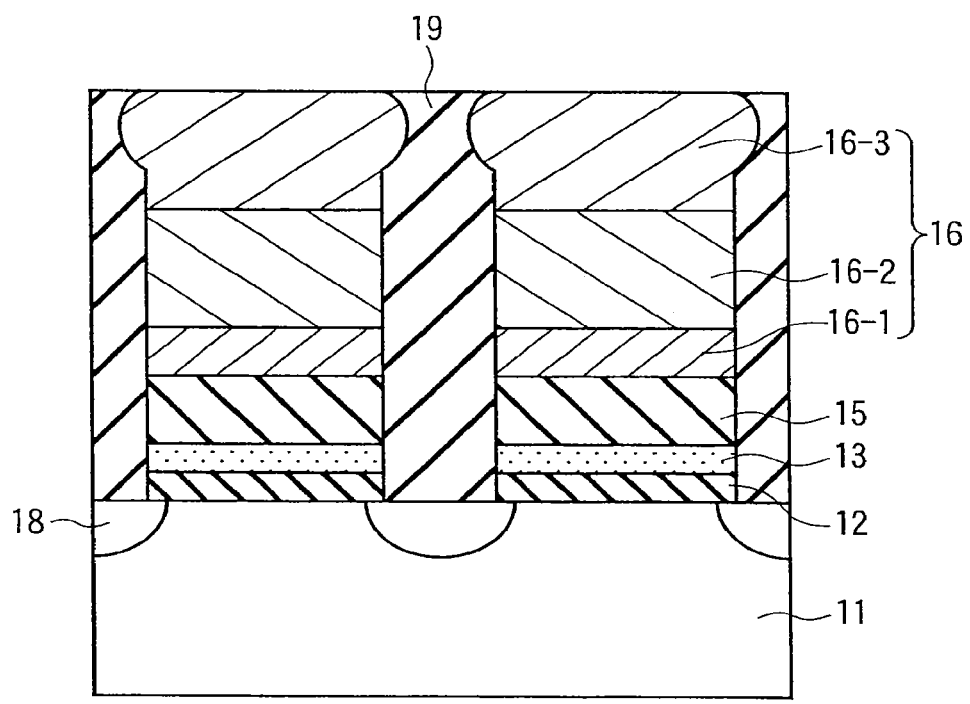
FIG. 8 is a sectional view in the direction of gate length of a memory cell transistor portion of a NAND nonvolatile semiconductor memory as a comparative example.

As a comparative example, the structure of a memory cell transistor portion of a conventional NAND nonvolatile semiconductor memory is illustrated in FIG. 8, in which corresponding parts to those in FIG. 1 are denoted by like reference numbers. As shown in FIG. 8, first to third electrode layers 16-1 to 16-3 are made substantially equal in the dimension in the direction of gate length. That is, in FIG. 8, the spacing between the second electrode layers 16-2 or the third electrode layers 16-3 in the adjacent gate electrodes is shorter than in FIG. 1 by twice the dimension of the first insulating film 17 in the direction of gate length.

Furthermore, the upper portion of the third electrode layer 16-3 will expand in the direction of gate length to be subjected to silicidation. As a result, the possibility will increase that the third gate electrode layer 16-3 is shorted between the adjacent gate electrodes.

If the spacing of adjacent gate electrodes is increased in order to prevent the third gate electrode layer from being shorted between the adjacent gate electrodes in the structure of FIG. 8, the length of the gate electrode of the first to third electrode layers 16-1 to 16-3 will decrease. Then the characteristic of memory cell transistors degrades.

Depending on the kind of metal used for the first gate electrode layer 16-1, edges of the metal electrode may turn into an insulator after oxidized by a thermal process. In such an event, the characteristics of memory cell transistors will degrade remarkably.

In the structure shown in FIG. 1, on the other hand, the first electrode layer 16-1 has a larger dimension in the direction of gate length than the second and third electrode layers 16-2 and 16-3. Therefore, even if the upper portion of the third gate electrode layer 16-3 expands in the direction of gate length, shortening of the second or third gate electrode layer 16-2 or 16-3 between adjacent gate electrodes can be suppressed.

Moreover, the dimension in the direction of gate length of the first gate electrode 16-1 does not decrease. As a result, the dimension in the direction of gate length of the first electrode layer 16-1 which electrically functions as the gate length of a transistor can be increased. For this reason, it becomes possible to prevent degrading the characteristics of the memory cell transistors due to the short-channel effect.

As the block insulating film 15, use is made of a film of, say, $Al_2O_3$ which has a larger dielectric constant than the tunnel insulating film 12 of, say, silicon oxide and the second insulating film 19 of, say, silicon oxide. For this reason, the magnitude of an electric field applied to the edges of the gate electrode during programming or erasing is reduced due to the effect of fringe capacitance. However, the effect of the fringe capacitance can be reduced by increasing the dimension of the first electrode layer 16-1 in the direction of gate length and the magnitude of the electric field applied to the gate insulating film of the memory cell transistor can be increased. For this reason, it becomes possible to prevent the write/erase characteristics of the memory cell transistor from being degraded.

Figure 4:
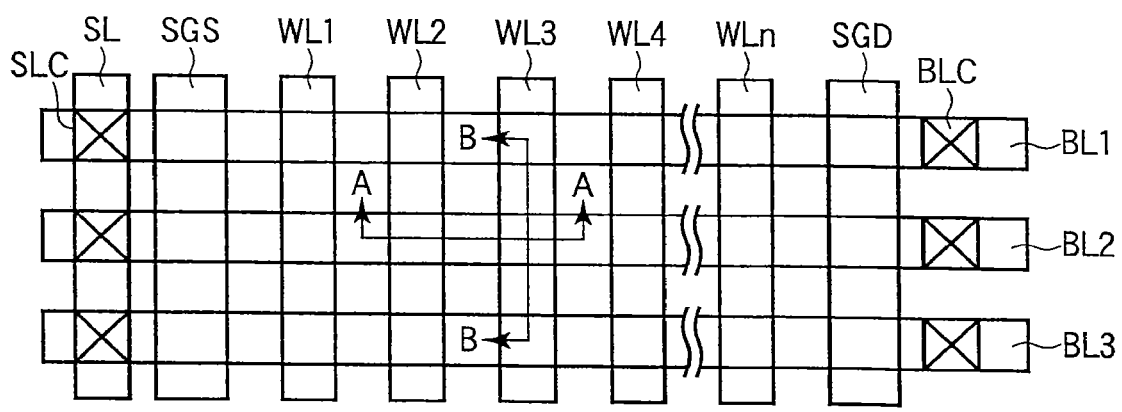
FIG. 4 is a schematic plan view of the NAND nonvolatile semiconductor memory of FIG. 3.

FIG. 3 shows the circuit arrangement of a NAND nonvolatile semiconductor memory as an example of a nonvolatile semiconductor storage device using memory cells of the structure shown in FIGS. 1 and 2. FIG. 4 is a schematic plan view of the NAND nonvolatile semiconductor memory of FIG. 3.

As shown in FIG. 3, the semiconductor storage device, indicated generally at 70, is provided with a number of NAND cell units. A plurality of NAND cell units forms a memory cell block, and a plurality of memory cell blocks constitutes a memory cell array. Here, the semiconductor storage device 70 is a NAND flash memory.

The NAND cell unit is provided with select transistors STR on the side of each bit line BL connected to a sense amplifier (not shown) and on the side of a source line SL. Between the two select transistors STR associated with the same bit line are connected in series a plurality of memory cell transistors MTR. Each of bit lines BL1, BL2 and BL3 intersects a control line SGD, word lines WL1, WL2, . . . , WLn, a control line SGS, and the source line SL.

The control line SGD is connected in common to the gates of the select transistors STR on the sense amplifier side of the bit lines BL1 to BL3. The word line WLn is connected in common to the control gates of memory cell transistors MTR each of which is the n-th one of the cell transistors in series connected to a respective one of the bit lines BL1 to BL3. The word line WL4 is connected in common to the control gates of memory cell transistors MTR each of which is the fourth one of the cell transistors connected in series with a respective one of the bit lines BL1 to BL3. The word line WL3 is connected in common to the control gates of memory cell transistors MTR each of which is the third one of the cell transistors connected in series with a respective one of the bit lines BL1 to BL3. The word line WL2 is connected in common to the control gates of memory cell transistors MTR each of which is the second one of the cell transistors connected in series with a respective one of the bit lines BL1 to BL3. The word line WL1 is connected in common to the control gates of memory cell transistors MTR each of which is the first one of the cell transistors connected in series with a respective one of the bit lines BL1 to BL3. The control line SGS is connected in common to the gates of the select transistors STR on the source line side of the bit lines BL1 to BL3.

In the semiconductor storage device 70, as shown in FIG. 4, the source line SL, the control line SGS, the word lines WL1 to WLn and the control line SGGD are arranged apart from one another and in parallel with one another in the horizontal direction of the drawing. The bit lines BL1 to BL3 are arranged apart from one another and in parallel with one another in the vertical direction of the drawing. The device regions are formed below each of the bit lines BL and the device isolation regions is formed between each device region.

That is, it can be said that the semiconductor substrate is separated into a number of device regions by the device isolation regions. At the intersections of the source line SL and the bit lines BL1 to BL3, source line contacts SLC are formed. A bit line contact BLC is formed in that portion of each bit line BL which is located between the control line SGD and the corresponding sense amplifier (not shown).

At each of the intersections of the word lines WL1 to WLn and the bit lines BL1 to BL3, one of the memory cell transistors MTR is placed. Likewise, at each of the intersections of the control lines SGS and SGD and the bit lines BL1 to BL3, one of the select transistors STR is placed.

A sectional view taken along line A-A of FIG. 4 corresponds to FIG. 1, while a sectional view taken along line B-B of FIG. 4 corresponds to FIG. 2.

Reference is next made to FIGS. 5A through 5F to describe a method of manufacturing the nonvolatile semiconductor memory according to the present embodiment.

Figure 5A:
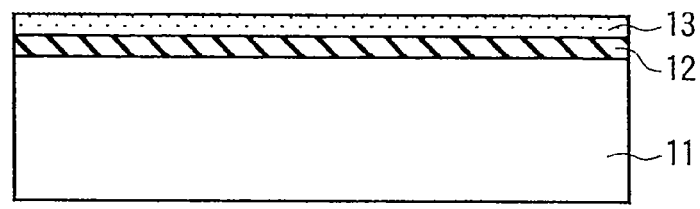

First, as shown in FIG. 5A, a film of silicon oxide is formed on the silicon substrate 11, the film of silicon oxide serves as the tunnel insulating film 12 of the memory cell transistors, at a thickness of, say, 4 nm through, for example, thermal oxidation. Next, well/channel regions (not shown) of the memory cells are formed by ion implantation. Then, a film of silicon nitride is formed the tunnel insulating film 12, the film of silicon nitride serves as the charge storage layer 13, at a thickness of 7 nm through the use of, for example, chemical vapor deposition (CVD).

Next, though not shown, a mask material consisting of stacked films of, for example, silicon oxide and silicon nitride is deposited onto the charge storage layer 13 and then predestinate areas of device isolation regions are opened by lithography. The mask material, the charge storage layer 13, the tunnel insulating film 12 and the silicon substrate 11 are etched in sequence to form trenches for device isolation regions in the silicon substrate 11. After that, the trenches formed in the silicon substrate 11 are filled with a device isolation insulating film of, for example, silicon oxide. Subsequently, the device isolation insulating film is planarized by chemical mechanical polishing (CMP) and then etched so that its surface is at substantially the same level as the top of the charge storage layer 13. After that, the mask material is removed. Thereby, the device isolation regions 14 are formed.

Figure 5B:
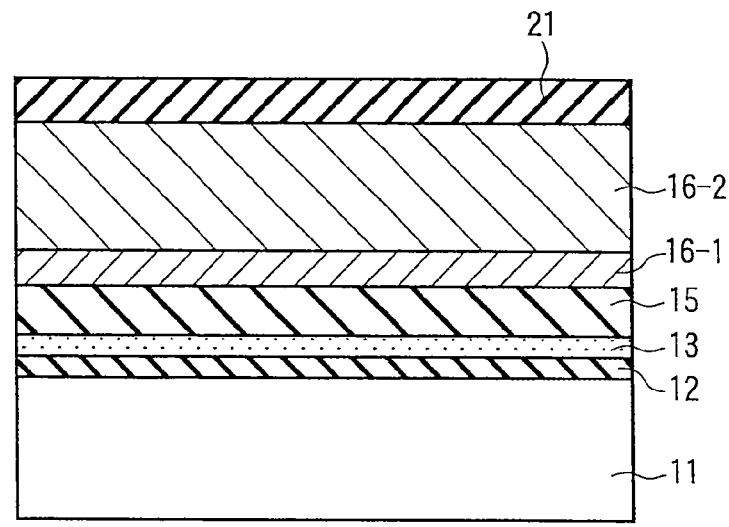

As shown in FIG. 5B, a film of $Al_2O_3$ that forms the block insulating film 15 is formed to a thickness of, say, 15 nm. After that, a TaN film of 10 nm thickness that forms the first gate electrode layer 16-1, a polysilicon film of 40 nm thickness that forms the second electrode layer 16-2 and a silicon nitride film 21 which forms the mask material for gate electrode processing are formed in sequence. Here, the TaN film has a large work function and is particularly useful as a material which does not react with $Al_2O_3$.

Figure 5C:
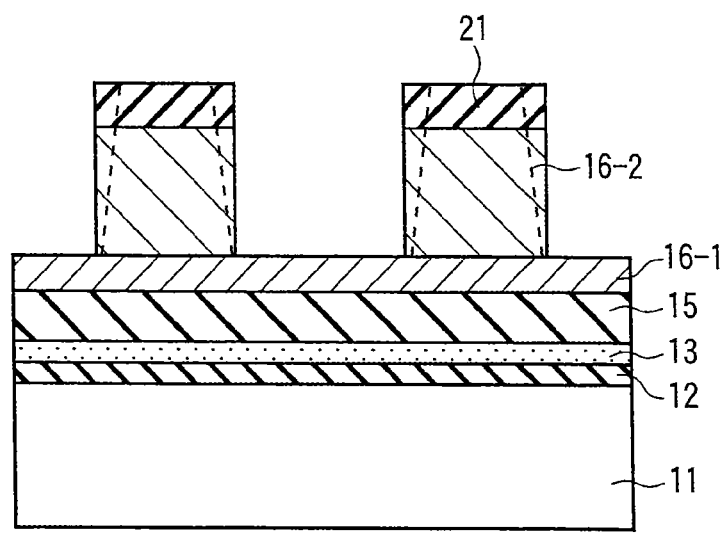

As shown in FIG. 5C, the silicon nitride film 21 is etched into the gate electrode pattern by lithographic techniques and then the second gate electrode layer 16-2 is selectively etched by reactive ion etching (RIE) using the etched silicon nitride film 21 as a mask.

As shown in FIG. 5D, the silicon oxide film 17 is deposited to form a sidewall mask for processing the first gate electrode layer 16-1 and then a sidewall insulating film (first insulating film) is formed by etching. Specifically, the silicon oxide film is deposited over the entire surface in the state shown in FIG. 5C. Then a sidewall insulating film is etched by an anisotropic etching, such as RIE, to leave the silicon oxide film 17 only on the sidewalls of the second gate electrode layer 16-2. That is, a sidewall insulating film consisting of the silicon oxide film 17 is formed in a self-aligned manner.

As shown in FIG. 5E, using the silicon nitride film 21 and the silicon oxide film 17 as a mask, the first gate electrode layer (TaN) 16-1, the block insulating film ($Al_2O_3$) 15, the charge storage layer (silicon nitride) 13 and the tunnel insulating film (silicon oxide) 12 are etched in sequence. Thereby, each of the films from the first gate electrode layer 16-1 through the tunnel insulating film 12 is processed to have a larger dimension in the direction of gate length than the second gate electrode layer 16-2 by twice the thickness (dimension in the direction of gate length) of the sidewall insulating film 17.

In this etching process, etching may be stopped after the first gate electrode layer 16-1 (or the first gate electrode layer 16-1 and the block insulating film 15, or the first gate electrode layer 16-1, the block insulating film 15 and the charge storage layer 13) has been selectively etched away. This is, adjacent memory cells can operate as MONOS cells if at least the first gate electrode layer 16-1 has been separated into adjacent gate electrodes of the respective memory cells.

As shown in FIG. 5F, the source/drain diffusion layers 18 of the memory cell transistors are formed in the surface of the silicon substrate 11 by ion implantation using the silicon nitride film 21 and the silicon oxide film 17 as a mask. Then, the silicon oxide film (second insulating film) 19 is deposited and then a top of the silicon oxide film is planarized by CMP.

Next, the silicon nitride film 21 are etched away to expose the top surface of the second gate electrode layer 16-2. At that time, the silicon oxide film 17 and the silicon oxide film 19 may be partly etched away and side surface of top of the second gate electrode layer 16-2 is exposed. Then, a top portion of the second gate electrode layer 16-2 is turn into a silicide. A film of NiSi, which forms the third gate electrode layer 16-3 of low resistivity, is then formed to a thickness of, say, 20 nm, thereby obtaining the structure shown in FIGS. 1 and 2. Though not shown, this process causes the upper portion of the third gate electrode layer 16-3 to expand in the direction of gate length.

After that, an interlayer insulating film, contact electrodes and layers of interconnections are formed using generally known techniques, whereby a nonvolatile semiconductor memory is completed.

According to the present embodiment, as described above, the second electrode layer 16-2 and the third electrode layer 16-3 are formed with the insulating film 17 on the side, but the first electrode layer 16-1 is not formed with the insulating film 17 on the side. Then it is possible to prevent the gate length from being reduced while suppressing short-circuiting of adjacent gates. Since the spacing between adjacent gates is short, it is possible to secure sufficient gate length even if the edges of the first electrode layer 16-1 are oxidized.

Accordingly, the deterioration of the characteristics of memory cell transistors, such as the deterioration of the short-channel characteristic, the deterioration of the program/erase characteristic due to the effect of fringe capacitance at the edges of the gate electrodes, etc., can be prevented.

In addition, the use of an insulating film which has a high dielectric constant like Al2O3 as the block insulating film 15 allows its leakage current to be reduced. Moreover, the use of a material which contains a metal, such as TaN, and has a large work function as the first gate electrode layer 16-1 allows the work function of the gate electrode to be made large. Thereby, it becomes possible to suppress the injection of electrons from the gate electrode through the block insulating film into the charge storage film in an erase operation and prevent the deterioration of the erase characteristic of the memory cell transistors. Furthermore, the use of a silicide as the third gate electrode 16-3 allows the gate electrode 16 to have low resistivity.

Second Embodiment

Figure 6:
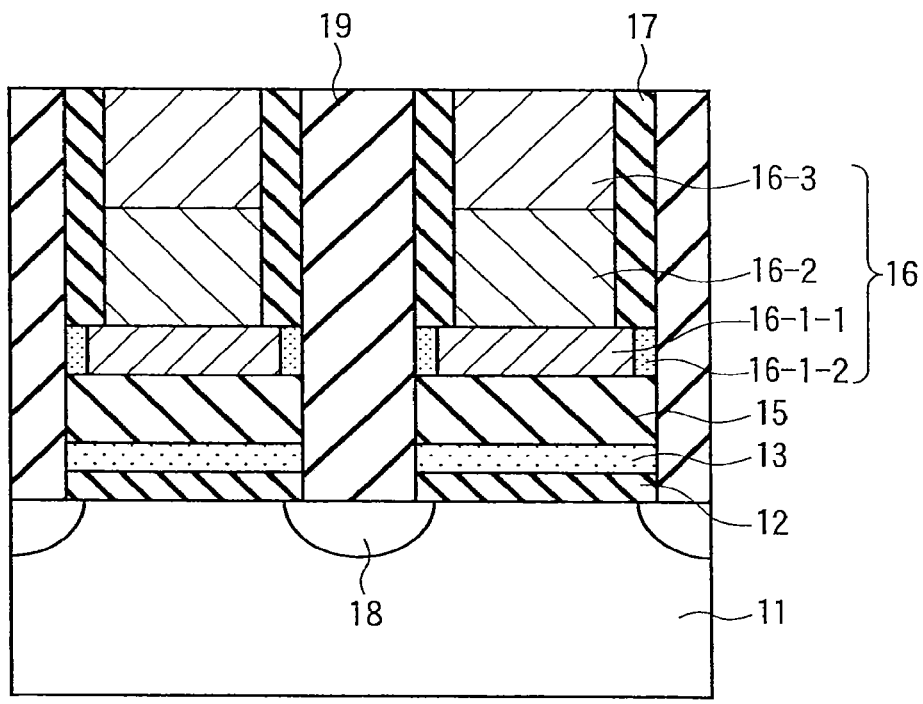
FIG. 6 is a sectional view in the direction of gate length of a memory cell transistor portion of a NAND nonvolatile semiconductor memory according to a second embodiment.

FIG. 6 is a sectional view in the direction of gate length of a memory cell transistor portion of a NAND nonvolatile semiconductor memory according to a second embodiment.

The second embodiment is different from the first embodiment in that the first gate electrode layer 16-1 contains oxygen in its edge portions which are opposed to each other in the direction of gate length.

As shown in FIG. 6, the first gate electrode layer 16-1 is formed from a film 16-1-1 of TaN in its central portion and a layer 15-1-2 which contains oxygen in TaN in its edge portions.

With the structure shown in FIG. 6, the layer 16-1-2 which contains oxygen in TaN, while having a larger resistivity than the TaN film 16-1-1, functions as a gate electrode; thus, the gate length in not short because of the film 16-1-2 will not reduce. Moreover, that the resistivity of the layer 16-1-2 which contains oxygen in TaN is larger than that of the TaN film 16-1-1 is effective in increasing the breakdown voltage between adjacent gate electrodes.

In addition, breakdown may occur when a high electric field is applied to the edges of the block insulating film (Al2O3) film 15, the charge storage layer (silicon nitride) 13 and the tunnel insulating film (silicon oxide) 12 which have reliability lowered due to etching damages of the gate electrodes forming. In the case of the present embodiment, however, the gate electrode layer 16-1 is made lower in resistivity in the edge portions than in the central portion owing to introduction of oxygen into the edge portions; thus, it becomes possible to prevent applying high electric field to the edges of the above-mentioned insulating films. Thereby, the reliability of the memory cell transistors can be increased.

The structure of the present embodiment can be fabricated in the following manner:

The structure shown in FIG. 5E is fabricated in the same manner as in the case of the first embodiment described previously. After that, heat treatment is carried out on the structure in an oxygen atmosphere, whereby the layer 16-1-2 which contains oxygen in TaN is formed at those edges of the first gate electrode layer 16-1 which are opposed to each other in the direction of gate length.

Even if the structure shown in FIG. 5F is heat treated without oxygen, oxygen can be supplied from the silicon oxide film 19 to form the layer 16-1-2 which contains oxygen in TaN at the edges of the first gate electrode layer 16-1 which are opposed to each other in the direction of gate length.

In order to reduce the number of processing steps, the heat treatment can also be carried out simultaneously with annealing to immobilize impurities in the source/drain diffusion layers 18. For example, after the structure shown in FIG. 5E has been fabricated, the gate electrode 16 is formed with a thin film of silicon oxide on the side of the gate electrode 16 such an extent that it does not fill in the gap between adjacent gate electrodes. Then, using the silicon oxide film as a spacer for implantation, the source/drain diffusion layers 18 of the memory cell transistors are formed in the surface of the silicon substrate 11 through ion implantation. Next, heat treatment is carried out under no oxygen atmosphere, whereby oxygen is supplied from the thin film of silicon oxide to the first gate electrode layer 16-1 and the impurities in the source/drain diffusion layers 18 are immobilized. After that, the silicon oxide film 19 is deposited. The subsequent processing steps remain unchanged from the first embodiment.

Figure 7:
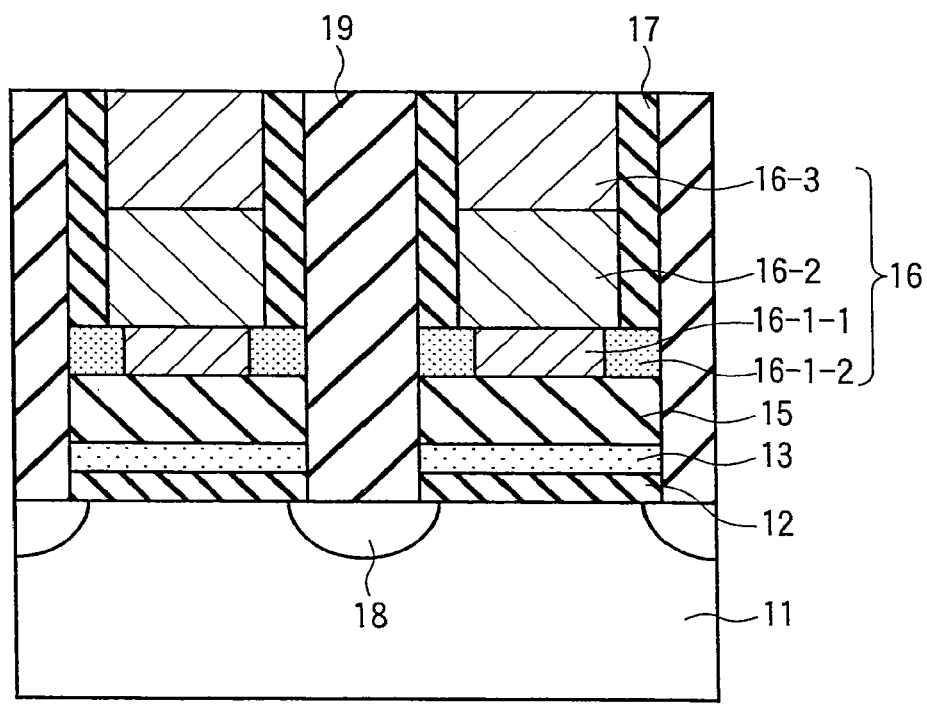
FIG. 7 is a sectional view in the direction of gate length of a memory cell transistor portion of a NAND nonvolatile semiconductor memory according to a modification of the second embodiment.

The present embodiment can offer the same advantages as described above even if the TaN film 16-1-1 is smaller than the second gate electrode layer 16-2 in the dimension in the direction of gate length as shown in FIG. 7. In other words, the present embodiment can achieve the same advantage as described above, even if the width of the layer 16-1-2 containing oxygen in TaN is smaller (FIG. 6) or larger (FIG. 7) than the width of the first insulating film 17.

In either of FIGS. 6 and 7, the dimension in the direction of gate length of the first electrode layer 16-1 is larger than that of the second and third electrode layers 16-2 and 16-3, which allows that dimension of the first electrode layer 16-1 function as the gate electrode. Then the transistor gate length to be made large while suppressing short-circuiting of adjacent second or third electrode layers 16-2 or 16-3. For this reason, it is possible to prevent the deterioration of the characteristics of the memory cell transistors due to the short-channel effect.

In addition, by making the dimension in the direction of gate length of the first electrode layer 16-1 large, the effect of fringe capacitance can be reduced and consequently the magnitude of the electric field applied to the gate insulating film of the memory cell transistors can be increased, thus making it possible to prevent the program/erase characteristics of the memory cell transistors from being deteriorated. Moreover, the gate insulating film and the insulating film between gate electrodes can be modified by the heat treatment carried out in supplying oxygen, thus preventing the reliability of the memory cell transistors from being lowered.

Modification

The present invention is not limited to the embodiments described above. In the embodiments, Al2O3 is used as the block insulating film; however, this is not restrictive. Use may be made of metal oxide films, such as HfSiOx, HfAlOx, LaAlOx, etc., which have a high dielectric constant. In addition, the first electrode layer of the gate electrode is not limited to TaN, but use may be made of a dielectric material, such as TaC, which does not react with the block insulating film and has a large work function. Moreover, the second electrode layer is not limited to polysilicon or NiSi, but use may be made of various metal materials which have low resistivity.

The thickness of each element need not be limited as illustrated in the embodiments but may be modified suitably according to specifications. Further, the memory cell transistor of the structure shown in FIGS. 1 and 2 is not limited to the use in a NAND nonvolatile semiconductor memory but may be used in various nonvolatile semiconductor storage devices.

The first gate electrode layer need not necessarily be etched vertically at its edges, but may be tapered at the edges on the upper side, as shown by the dashed lines in FIG. 5C. Likewise, the second gate electrode layer also need not necessarily have its sidewall etched vertically, but may be tapered at the edges such that the upper side is retracted relative to the underside, as also shown by the dashed lines in FIG. 5C. However, in order to suppress the short-circuiting of adjacent gates, it is required that the dimension in the direction of gate length of the underside of the second gate electrode layer be smaller than the dimension in the direction of gate length of the upper side of the first gate electrode layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor storage device, comprising:
   a memory cell transistor, the memory cell transistor comprising:
      a semiconductor substrate, the semiconductor substrate including a device region defined by an isolation region;
      a tunnel insulating film formed above the semiconductor substrate;
      a charge storage layer formed above the tunnel insulating film, the charge storage layer being a single layer including silicon, and the charge storage layer having a pattern aligned with the device region in a cross section of the memory cell transistor orthogonal to a gate length direction of the memory cell transistor;
      an insulating film formed above the charge storage layer, the insulating film having a gate pattern extending in a gate width direction of the memory cell transistor and having a dielectric constant larger than a dielectric constant of the tunnel insulating film, the gate width direction being orthogonal to the gate length direction and parallel to the cross section;
      a metal-containing layer formed above and in direct contact with the insulating film, the metal-containing layer having the gate pattern and including tantalum, the metal-containing layer being a conductive single layer; and
      a gate electrode layer formed above the metal-containing layer and constituted of a material different from a material of the metal-containing layer, the gate electrode layer having a dimension in the gate length direction smaller than a dimension in the gate length direction of the metal-containing layer and smaller than a dimension in the gate length direction of an under surface of a portion including the silicon of the charge storage layer.

2. The nonvolatile semiconductor storage device according to claim 1, wherein the material of the gate electrode layer is a metal.

3. The nonvolatile semiconductor storage device according to claim 1, wherein the dimension of the gate electrode layer is a gate length of the gate electrode layer, and a first length in the gate length direction of an under surface of the gate electrode layer is smaller than a second length in the gate length direction of an under surface of the metal-containing layer.

4. The nonvolatile semiconductor storage device according to claim 1, wherein the dielectric constant of a material of the insulating film is larger than a dielectric constant of silicon oxide.

5. The nonvolatile semiconductor storage device according to claim 1, wherein the insulating film includes a metal oxide.

6. The nonvolatile semiconductor storage device according to claim 1, wherein the insulating film includes hafnium silicon oxide.

7. The nonvolatile semiconductor storage device according to claim 1, wherein the memory cell transistor further comprises an intermediate layer formed between the metal-containing layer and the gate electrode layer, a resistivity of the gate electrode layer being lower than a resistivity of the intermediate layer.

8. The nonvolatile semiconductor storage device according to claim 7, wherein both sides of the gate electrode layer are located inside both sides of the metal-containing layer in the gate length direction.

9. The nonvolatile semiconductor storage device according to claim 7, wherein the dimension of the gate electrode layer is a gate length of the gate electrode layer, and a first length in the gate length direction of an under surface of the gate electrode layer is smaller than a second length in the gate length direction of an upper surface of the metal-containing layer and a third length in the gate length direction of an under surface of the metal-containing layer.

10. The nonvolatile semiconductor storage device according to claim 1, wherein a thickness of the gate electrode layer is larger than a thickness of the metal-containing layer.

11. The nonvolatile semiconductor storage device according to claim 1, wherein the gate electrode layer is tapered such that an upperside of the gate electrode layer is retracted relative to an underside of the gate electrode layer at edges.

12. The nonvolatile semiconductor storage device according to claim 1, wherein an upper surface of the insulating film is flush along the gate width direction.

13. A nonvolatile semiconductor storage device, comprising:
   a first memory cell and a second memory cell adjacent to the first memory cell in a first direction;
   the first memory cell comprising:
      a first tunnel insulator formed above a semiconductor substrate, the semiconductor substrate including a device region defined by a device isolation region;
      a first charge storage portion formed above the first tunnel insulator, the first charge storage portion being a single layer including silicon, and the first charge storage portion being isolated by the device isolation region in a second direction crossing the first direction;
      a first insulator formed above the first charge storage portion, the first insulator having a dielectric constant larger than a dielectric constant of the first tunnel insulator and the first insulator having a first pattern extending over the device region and the device isolation region along the second direction;
      a first tantalum-containing portion formed above and in direct contact with the first insulator, the first tantalum-containing portion being conductive in a first region containing tantalum; and
      a first gate electrode portion formed above the first tantalum-containing portion and constituted of a material different from a material of the first tantalum-containing portion, the first gate electrode portion having a dimension in the first direction smaller than a dimension in the first direction of the first tantalum-containing portion and smaller than a dimension in the first direction of an under surface of a portion including the silicon of the first charge storage portion; and
   the second memory cell comprising:
      a second tunnel insulator formed above the semiconductor substrate;
      a second charge storage portion formed above the second tunnel insulator, the second charge storage portion being a single layer including silicon, and the second charge storage portion being isolated by the device isolation region in the second direction;
      a second insulator formed above the second charge storage portion, the second insulator having a dielectric constant larger than a dielectric constant of the second tunnel insulator, the second insulator having a second pattern extending over the device region and the device isolation region along the second direction and the second insulator being apart from the first insulator in the first direction between the first memory cell and the second memory cell;
      a second tantalum-containing portion formed above and in direct contact with the second insulator, the second tantalum-containing portion being apart from the first tantalum-containing portion in the first direction between the first memory cell and the second memory cell, the second tantalum-containing portion being conductive in a second region containing tantalum; and
      a second gate electrode portion formed above the second tantalum-containing portion and constituted of a material different from a material of the second tantalum-containing portion, the second gate electrode portion having a dimension in the first direction smaller than a dimension in the first direction of the second tantalum-containing portion and smaller than a dimension in the first direction of an under surface of a portion including the silicon of the second charge storage portion.

14. The nonvolatile semiconductor storage device according to claim 13, wherein a gate length direction of the first gate electrode portion and a gate length direction of the second gate electrode portion are aligned in the first direction.

15. The nonvolatile semiconductor storage device according to claim 13, wherein the material of the first gate electrode portion and the material of the second gate electrode portion are a metal.

16. The nonvolatile semiconductor storage device according to claim 13, wherein the first memory cell further comprises a first intermediate portion formed between the first tantalum-containing portion and the first gate electrode portion, a resistivity of the first gate electrode portion being lower than a resistivity of the first intermediate portion, and
   the second memory cell further comprises a second intermediate portion formed between the second tantalum-containing portion and the second gate electrode portion, a resistivity of the second gate electrode portion being lower than a resistivity of the second intermediate portion.

17. The nonvolatile semiconductor storage device according to claim 13, wherein a thickness of the first gate electrode portion is larger than a thickness of the first tantalum-containing portion and a thickness of the second gate electrode portion is larger than a thickness of the second tantalum-containing portion.

18. The nonvolatile semiconductor storage device according to claim 13, wherein the first gate electrode portion and the second gate electrode portion are tapered such that an upperside of the first gate electrode portion is retracted relative to an underside of the first gate electrode portions at edges, and an upperside of the second gate electrode portion is retracted relative to an underside of the second gate electrode portion at edges.

19. The nonvolatile semiconductor storage device according to claim 13, wherein an upper surface of the first insulator and an upper surface of the second insulator are flush over the device region and the device isolation region.

20. The nonvolatile semiconductor storage device according to claim 1, wherein the dimension in the gate length direction of the metal-containing layer is smaller than the dimension in the gate length direction of the charge storage layer.

* * * * *